United States Patent [19]

Mori et al.

[11] Patent Number: 4,507,575

[45] Date of Patent: Mar. 26, 1985

[54] NAND LOGIC GATE CIRCUIT HAVING IMPROVED RESPONSE TIME

[75] Inventors: Susumu Mori; Hideaki Yamada, both of Tokyo, Japan

[73] Assignee: Nippon Electric Co., Ltd., Japan

[21] Appl. No.: 377,535

[22] Filed: May 12, 1982

[30] Foreign Application Priority Data

May 15, 1981 [JP] Japan .................................. 56-72911

[51] Int. Cl.[3] ................. H03K 19/088; H03K 19/013; H03K 17/04
[52] U.S. Cl. ..................................... 307/456; 307/443
[58] Field of Search ............... 307/456, 457, 458, 466, 307/443, 270

[56] References Cited

U.S. PATENT DOCUMENTS 4,355,246 10/1982 Usui ..................................... 307/456
4,413,194 11/1983 Birch ............................... 307/443 X

FOREIGN PATENT DOCUMENTS 0068832 1/1983 European Pat. Off. ............ 307/443

*Primary Examiner*—Stanley D. Miller
*Assistant Examiner*—David R. Bertelson
*Attorney, Agent, or Firm*—Remy J. VanOphem

[57] ABSTRACT

A NAND logic gate circuit having a first input circuit receiving a first input signal, an inverter circuit for inverting the output of the first input circuit, a second input circuit for receiving a second input signal, an AND gate circuit for producing a logical AND output signal in response to the outputs of the inverter circuit and the second input circuit, and a PNP transistor responsive to the second input signal having a low value for controlling the value of the output signal of the first input circuit independent of the value of the first input signal. The NAND gate circuit has a faster response time to changes in the value of the first input signal than comparable prior art circuits and reduces the current flow to the second input terminal when the first input signal is high and the second input signal is low.

5 Claims, 6 Drawing Figures

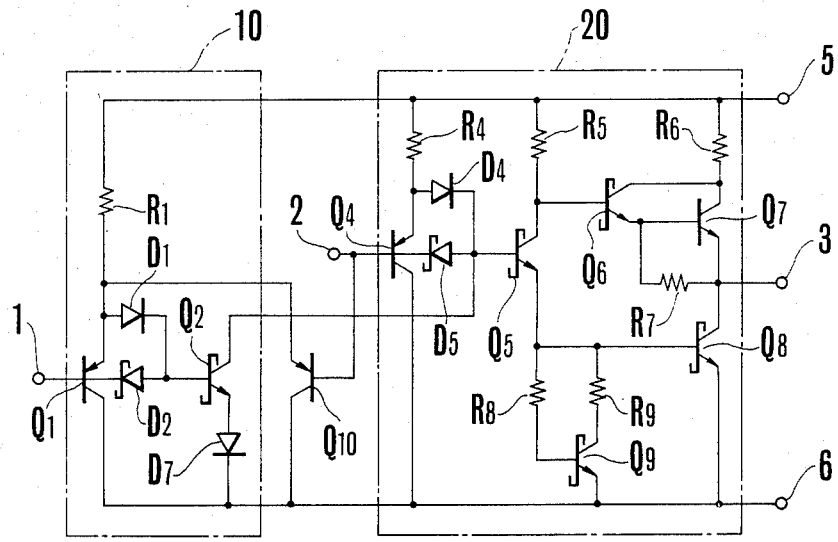
F I G. 3

NAND LOGIC GATE CIRCUIT HAVING IMPROVED RESPONSE TIME

BACKGROUND OF THE INVENTION

1. Field of the Invention

This invention relates to a logic gate circuit, particularly to a TTL (transistor-transistor logic).

2. Description of the Prior Art

In digital logic circuits, logic gates constructed as illustrated in FIGS. 1a and 1b are frequently used. These logic gates possess two input terminals and one output terminal. They fulfill a NAND function by a "not" signal of a first input and a second input signal or an OR function by a first input signal and a "not" signal of a second input. Let A stand for the logic at a first input terminal 1, B for the logic at a second input terminal 2, and Y for the logic at an output terminal 3, for example, and $Y = \overline{A} \cdot B$ will be satisfied in the case of the logic gate of FIG. 1a and $Y = A + \overline{B}$ in the case of the logic gate of FIG. 1b. The four possible logic states for various combination of two inputs to these logic gates are shown in a truth table of Table 1.

TABLE 1

| Input 1 | Input 2 | Output 3 |
| --- | --- | --- |
| H | L | H |
| L | L | H |
| H | H | H |
| L | H | L |

In the past, a TTL circuit of the type which fulfills the aforementioned functions, possesses a threshold circuit voltage equal to a voltage for two PN-junction stages (about 1.4 V), and uses a PNP transistor in the input stage in order to suppress the current possibly flowing to the input terminal when the input is of a low-level (hereinafter simply referred to as low-level input current). The circuit as shown in FIG. 2 is well known. In FIG. 2, reference numeral 1 denotes a first input terminal, 2 a second input terminal, 3 an output terminal, 4 an output part of an inverter circuit 10 which has the input terminal 1 as its input, 5 a power supply terminal, 6 a ground terminal, and 20 a NAND circuit having the input terminal 2 and the output 4 of the aforementioned inverter circuit 10 as its input. The transistors Q1, Q2, and Q3 are an input-stage transistor, an intermediate-stage transistor, and an output-stage transistor, respectively, of the inverter circuit 10, and the transistors Q4, Q5, Q6, Q7, Q8 and Q9 are an input-stage transistor, a phase split stage transistor, an off-buffer preceding stage transistor, an off-buffer succeeding stage transistor, an output-stage transistor, and a pulldown transistor, respectively, of the NAND circuit 20. In this circuit, for the purpose of suppressing the low-level input current, the transistors Q1 and Q4 are PNP transistors as described above. For all the transistors with the exception of the transistors Q1, Q4 and Q7, transistors are used whose base-collectors are clamped with Schottky barrier diodes (SBD) to prevent saturation. The diodes D1, D2, and D3 are a level shift diode, a speed-up SBD, and an output-level shift diode, respectively, of the inverter circuit 10, and the diodes D4, D5, and D6 are a level shift diode, a speed-up SBD, and an input gate SBD, respectively, of the NAND circuit 20. The resistors R1 to R9 typically have values of resistance as shown in Table 2.

TABLE 2

| Value of Resistance in Conventional Circuit | |
| --- | --- |
| Designation of resistor | Value of resistance (kΩ) |
| R1 | 6 |
| R2 | 6 |
| R3 | 4 |
| R4 | 6 |
| R5 | 4 |
| R6 | 0.05 |
| R7 | 5 |
| R8 | 1.5 |
| R9 | 3 |

In the circuit under discussion, as well known in the art, when the input at the input terminal 2 is in the low-level state (hereinafter simply referred to as "L"), the input-stage PNP transistor Q4 and the SBD D5 are rendered conductive and hence the base drive current for the phase split stage transistor Q5 disappears, so that the transistor Q5 and the output-stage transistor Q8 are turned off whereas the off-buffer transistors Q6 and Q7 are turned on, thereby producing a high level state (hereinafter simply referred to as "H") at the output terminal 3. When the input terminal 2 is in the "H" state, the transistor Q4 and the SBD D5 are turned off and, consequently, the operation of the phase split stage transistor Q5 is determined by the state of the input terminal 1, namely, by the state of the output 4 of the inverter circuit 10. More specifically, when the input terminal 1 is in the "H" state, the input-stage PNP transistor Q1 and the SBD D2 are turned off and the level shift diode D1, the intermediate-stage transistor Q2, and the output-stage transistor Q3 are turned on. Consequently, the electric current in the resistor R4 flows through the collector of the transistor Q3 through the diode D4 and the SBD D6. Similarly, when the input terminal 2 is in the state "L", therefore, the phase split stage transistor Q5 and the output-stage transistor Q8 of the NAND circuit 20 are turned off and the output terminal 3 assumes the "H" state. Conversely, when the input terminal 1 is in the state "L" state, the PNP transistor Q1 and the SBD D2 are turned on and the intermediate-stage transistor Q2 and the output-stage transistor Q3 are turned off, with the result that the electric current in the resistor R4 of the NAND circuit 20 flows through the diode D4 and serves as the base drive current for the phase split stage transistor Q5. As a result, the transistor Q5 and the output-stage transistor Q8 are turned on and the output terminal 3 assumes the state "L".

However, with the conventional TTL circuit shown in FIG. 2, in order to change the base level of the phase split stage transistor Q5 in the NAND circuit 20 in concert with the change in the level of the input terminal 1 when the input terminal 2 is in the state "H", it is necessary to send the signal at the input terminal 1 to the base of the phase split stage transistor Q5 via a number of elements including the PNP transistor Q1, the diode D1, and the transistors Q2 and Q3 of the inverter circuit 10 as well as the input gate SBD D6 of the NAND circuit 20. As a result, the delay time for signal transmission from the input terminal 1 to the base of the transistor Q5, namely, to the output terminal 3 (hereinafter simply referred to as "tpd") will be increased. In the case of the conventional circuit of FIG. 2 which has the values of resistance as shown in Table 2, for example, the turn-on time (hereinafter simply referred to as "tpHL") and the turn-off time (hereinafter simply referred to as "tpLH") which are required between the input terminal 2 and the output terminal 3 have relatively small values of 7 ns and 8 ns, respectively. The tpHL and the tpLH required between the input terminal 1 and the output terminal 3 have rather large values of 11 ns and 14 ns, respectively. The conventional circuit, therefore, has proved to be unsuitable for circuit switching.

Further, in the conventional circuit of FIG. 2, the "tpd" between the input terminal 1 and the base of the phase split stage transistor Q5 in the NAND circuit 20 is large as compared with the "tpd" between the input terminal 2 and the base of the transistor Q5 as described previously. Therefore, when both the input terminals 1 and 2 change from "L" to "H", the base of the phase split stage transistor Q5 assumes the state "H" until the output 4 of the inverter circuit 10 changes from "H" to "L" in response to the change of the input terminal 1 from "L" to "H", thereby turning on the transistor Q5 and consequently the output-stage transistor Q8. Thus, the output terminal 3 which should assume "H" is rendered "L" during the period of the above operation.

The conventional TTL circuit also requires, for transmission of the inverted signal at the input terminal to the base of the phase split stage transistor Q5 in the NAND circuit 20, ten circuit elements, i.e. three resistors, four diodes, and three transistors. The multiplicity of the circuit elements raises another problem of large power consumption in the circuit.

As described above, the conventional TTL circuit as shown in FIG. 2, which fulfills the functions of the logic gates of FIGS. 1a and 1b, possesses a threshold circuit voltage equal to a voltage for two PN-junction stage. In this arrangement, and uses a PNP transistor in the input stage, difficulties are encountered which involve the tendency to erroneous operation due to the large "tpd" in the longest path and the consequent difference between the values of "tpd" regarding the two inputs, the increase in the number of circuit elements, and the large power consumption.

SUMMARY OF THE INVENTION

The invention obviates the above conventional drawbacks and has for its object to provide a logic gate circuit which can improve the "tpd" in the circuit and the difference between the values of "tpd" regarding the two input terminals, as well as reduce the number of circuit elements, the power consumption, and the low-level input current.

The invention is a logic gate circuit consisting of an inverter circuit having a first gate input circuit including a first PNP transistor having its base connected to a first input terminal, its collector connected to a ground terminal, its emitter connected to a power supply terminal via a first resistor, a first output circuit including a first NPN transistor having its base connected to an output of the first gate input circuit; and a NAND circuit consisting of a second gate input circuit including a second PNP transistor having its base connected to a second input terminal, its collector connected to the ground terminal, and its emitter connected to the power supply terminal via a second resistor, a second output circuit including a second NPN transistor having its collector connected to an output terminal and its emitter connected to the ground terminal, and a phase split stage circuit including a third NPN transistor having its emitter connected to the base of the second NPN transistor, its collector connected to the power supply terminal via a third resistor, and its base connected to an output of the second gate input circuit and to an output of the inverter circuit. A third PNP transistor having its emitter connected to the emitter of the first PNP transistor in the inverter circuit, its base connected to the second input terminal, and its collector connected to the ground terminal is added for decreasing the amount of electric current which flows out to the second input terminal when the first input terminal is at a high level and the second input terminal is at a low level.

BRIEF DESCRIPTION OF THE DRAWINGS

FIG. 3 is a circuit diagram illustrating a preferred embodiment of a TTL of the present invention possessing the functions of FIGS. 1a and 1b;

FIG. 4b is a section view taken along line IVb–IVb' of FIG. 4a.

DETAILED DESCRIPTION OF THE PREFERRED EMBODIMENT

The circuit of the present invention will be described in detail with reference to the accompanying drawings.

Figure 1A:
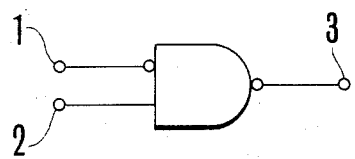
FIGS. 1a and 1b are block diagrams of digital logic gates to which the present invention is applied.
Figure 1B:
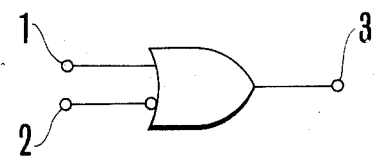
Figure 2:
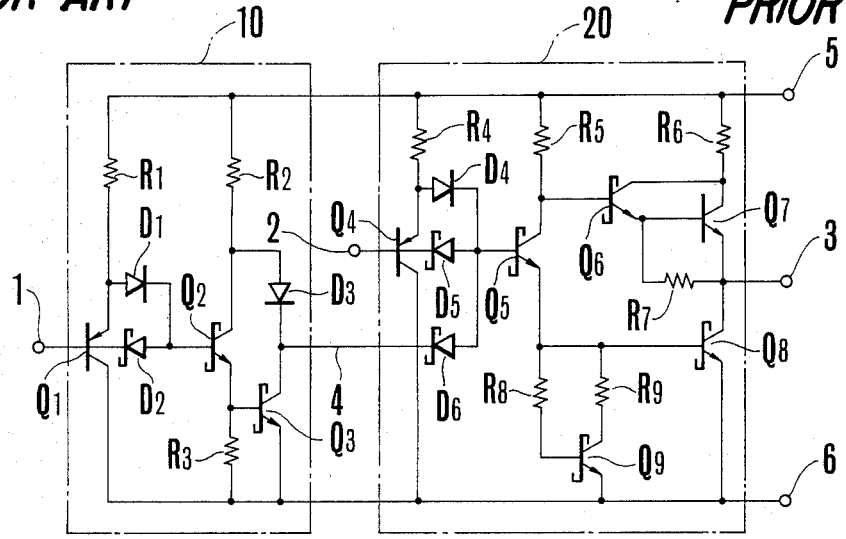
FIG. 2 is a circuit diagram illustrating a typical conventional TTL possessing the functions of FIGS. 1a and 1b.

FIG. 3 is a circuit diagram illustrating the present invention. This circuit differs from the conventional circuit shown in FIG. 2, in that, the output level shift diode D3, the output stage transistor Q3, the pull-up resistor R2 in the collector of the intermediate stage transistor Q2, the base charge pull-out resistor R3 for the transistor Q3 included in the inverter circuit 10, and the gate input SBD D6 included in the NAND circuit 20 are eliminated and instead, a PN junction diode D7 connected between the emitter of the output stage transistor Q2 in the inverter circuit 10 and the ground terminal 6 and a PNP transistor Q10 having its emitter, base, and collector connected respectively to the emitter of the gate input PNP transistor Q1, the second input terminal 2, and the ground terminal 6. As will be described later, the diode D7 is a level shift diode adapted to retain the threshold voltage of the inverter circuit 10 at a voltage equal to the PN junction forward voltage for two stages and the PNP transistor Q10 is adapted to prevent the electric current in the resistor R1 of the inverter circuit 10 from flowing to the input terminal 2 through the diode D1, the base-collector junction of the transistor Q2, the clamp SBD, and the SBD D5 of the NAND circuit 20 when the input terminal 1 is in the "H" state and the input terminal 2 is in the "L" state. In FIG. 3, the elements fulfilling the same functions as those of the conventional circuit are denoted by like symbols used in FIG. 2. As concerns the transistor Q2 in the inverter circuit 10, while it functions as an intermediate stage transistor in the conventional circuit of FIG. 2, the collector of the transistor Q2 forms the output part of the inverter circuit 10 in the circuit shown in FIG. 3. In FIG. 3, therefore, the transistor Q2 is called an output stage transistor. Typical values of resistance of resistors involved in the FIG. 3 circuit are shown in Table 3.

TABLE 3

| Resistance in Circuit of This Invention | |
| --- | --- |
| Designation of resistor | Value of resistance (kΩ) |
| R1 | 6 |
| R4 | 6 |
| R5 | 4 |
| R6 | 0.05 |
| R7 | 5 |
| R8 | 1.3 |
| R9 | 3 |

Now, the operation of the circuit of this invention constructed as described above will be described.

First, when the input terminal 2 is in the "L" state, the input PNP transistor Q4 and the SBD D5 are turned on the base potential, $V_{BQ5}$, of the phase split stage transistor Q5 satisfies the following equation independent of the state of the input terminal 1:

$$V_{BQ5} = V_{IL2} + V_{FD5} \qquad (1)$$

where $V_{IL2}$ and $V_{FD5}$ denote respectively the low-level input voltage of the input terminal 2 and the forward voltage of the SBD D5. Generally, the $V_{FD5}$ is about 0.45 V and the $V_{IL2}$ being not more than 0.8 V, the $V_{BQ5}$ is below about 1.25 V which is a potential below the voltage (about 1.4 V) which is required for turning on the phase split stage transistor Q5 and the output stage transistor Q8. Consequently, the transistors Q5 and Q8 are turned off and the output terminal 3 assumes the "H" state.

Next, when the input terminal 2 is in the "H" state, the input PNP transistor Q4 and the SBD D5 are turned off and the operation of the phase split stage transistor Q5 is determined by the state of the input terminal 1, especially, the output part of the inverter circuit 10. To be specific, when the input terminal 1 is in the "H" state, the PNP transistor Q1 and the SBD D2 are turned off and the diode D1 and the intermediate stage transistor Q2 are turned on. In this state, the collector potential $V_{CQ2}$ of the transistor Q2 and, consequently the base potential $V_{BQ5}$ of the phase split stage transistor Q5 in the NAND circuit 20 satisfies the following equation:

$$V_{BQ5} = (V_{CQ2}) = V_{FD7} + V_{CEQ2} \qquad (2)$$

where $V_{FD7}$ denotes the forward voltage of the level shift diode D7 in the inverter circuit 10 and $V_{CEQ2}$ denotes the collector-emitter voltage when the transistor Q2 is in conduction. Generally, the values of $V_{FD7}$ and $V_{CEQ2}$ are about 0.7 V and 0.3 V, respectively. When these values are substituted in the above equation (2), the value of $V_{BQ5}$ is about 1.0 V. Consequently, the transistors Q5 and Q8 are turned off and the output terminal 3 assumes the "H" state.

When the input terminal 1 is in the "L" state and the input terminal 2 in the "H" state, the input PNP transistor Q1 and the SBD D2 in the inverter circuit 10 are turned on and the transistor Q2 is turned off. Consequently, the electric current in the resistor R4 and the diode D4 in the NAND circuit 20 drives the base of the phase split stage transistor Q5 to turn on the transistor Q5 and the output stage transistor Q8. In this case, therefore, the output terminal 3 assumes the "L" state.

From the foregoing description, it is noted that the circuit of the present invention carries out the logic operations indicated in Table 1 for all the combinations of the state of the input terminals 1 and 2.

The operation of the input PNP transistor Q10 featuring the circuit of this invention will now be described. Generally, a PNP transistor is used in the input stage for the purpose of decreasing the low-level input electric current and increasing fan-out networks to be connected as the preceding stage. If the PNP transistor Q10 is disconnected from the circuit of FIG. 3, however, the low-level input current $I_{IL2}$ which flows to the input terminal 2 when the input terminal 1 is in the "H" state and the input terminal 2 in the "L" state will have the following value.

$$I_{IL2} = \frac{V_{CC} - V_{FD1} - V_{FSBDQ2} - V_{FD5} - V_{IL2}}{R_1} + \qquad (3)$$

$$\frac{V_{CC} - V_{BEQ4} - V_{IL2}}{(1 + \beta Q4) \cdot R_4}$$

The meanings of the various symbols involved in this equation and typical values thereof are shown below.

| Symbol | Typical value | Meaning of symbol |
| --- | --- | --- |
| $V_{CC}$ | 5 V | Voltage of the power supply terminal 5 |
| $V_{FD1}$ | 0.7 V | Forward voltage of PN diode D1 |
| $V_{FSBDQ2}$ | 0.45 V | Forward voltage of SBD for clamping base-collector of transistor Q2 |
| $V_{FD5}$ | 0.45 V | Forward voltage of SBD D5 |
| $V_{IL2}$ | 0.4 V | Voltage of input terminal 2 during measurement of low-level input electric current |
| $V_{BEQ4}$ | 0.7 V | Forward base-emitter voltage of PNP transistor Q4 |
| $\beta Q4$ | 10 | Direct current-amplification factor of PNP transistor Q4 |

When the typical values shown above are substituted in equation (3), the first and second terms in the righthand member of this equation are 500 μA and 60 μA, respectively, indicating that $I_{IL2}$ will be governed substantially by the first term of the righthand member of the equation. Moreover, the value of $I_{IL2}$ which is 560 μA far exceeds a standardized maximum 400 μA of the low-level input electric current specified for the general low-power Schottky TTL.

In the circuit of FIG. 3 in which the PNP transistor Q10 is connected, however, the emitter-base junction of the transistor Q10 is forwardly biased and the transistor Q10 is turned on when the input terminal 1 is in the "H" state and the input terminal 2 is in the "L" state. Consequently, most of the electric current in the resistor R1 is passed to the ground terminal 6 via the emitter-collector of the PNP transistor Q10 and is not drawn to the input terminal 2. In this case, therefore, the low-level input current $I_{IL2}$ of the input terminal 2 has the following value:

$$I_{IL2} = \frac{V_{CC} - V_{BEQ10} - V_{IL2}}{(1 + \beta Q10) \cdot R_1} + \frac{V_{CC} - V_{BEQ4} - V_{IL2}}{(1 + \beta Q4) \cdot R_4} \qquad (4)$$

where $V_{BEQ10}$ denotes the forward base-emitter voltage of the PNP transistor Q10 and $\beta Q10$ denotes the direct current-amplification factor of the PNP transistor Q10. Typical values of $V_{BEQ10}$ and $\beta Q10$ are approximately 0.7 V and 10, respectively. When these values are substituted in the equation (4), the first and the second terms in the righthand member of the equation are both about 60 μA and $I_{IL2}$ is about 120 μA. This value is about one fifth of the value (about 560 μA) which $I_{IL2}$ assumes when the transistor Q10 is disconnected from the circuit. It is seen that this transistor Q10 is effective for decreasing the value of $I_{IL2}$ to a great extent. When the circuit in FIG. 3 is integrated, the PNP transistors Q10 and Q4 can be formed within one and the same isolated region. From the standpoint of circuitry design, therefore, the addition of the PNP transistor Q10 brings about substantially no increase in the chip area.

Now, the delay time for signal transmission (tpd) in the circuit of FIG. 3 will be described. As has already been described, it is only when the input terminal 2 is in the state "H" that the signal of the input terminal 1 is transmited to the base of the phase split stage transistor Q5 in the NAND circuit 20. In the case of the conventional circuit shown in FIG. 2, in order that the input signal applied to the input terminal 1 may reach the base of the phase slit stage transistor Q5, this signal is required to run through five elements in total, i.e., the input PNP transistor Q1, the level shift diode D1, the intermediate stage transistor Q2, the output stage transistor Q3 in the inverter circuit 10 and the input gate SBD D6 in the NAND circuit 20. The delay time for transmission between the input terminal 1 and the output terminal 3 is such that tpdLH and tpdHL amount to large values of 14 ns and 11 ns respectively. Here, tpdLH denotes a "tpd" which exists when the output terminal 3 changes from "L" to "H" and tpdHL from "H" to "L" respectively. In contrast, in the circuit of the present invention, illustrated in FIG. 3, the signal from the input terminal 1 to the base of the phase split stage transistor Q5 is required to flow through only three elements, i.e., the input PNP transistor 01, the level shift diode D1, and the output stage transistor Q2 in the inverter circuit 10. Thus, this circuit proves advantageous in speeding up the circuit operation. In the case of the circuit of FIG. 3 which has the values of resistance shown in Table 3, the delay time for signal transmission between the input terminal 1 and the output terminal 3 is such that tpdLH is 10 ns and tpdHL is 8 ns. It is noted that this circuit provides a notable improvement in "tpd" as compared with the conventional circuit. Further in the circuit of FIG. 3, the "tpd" regarding the input terminal 1 is small so that substantially no difference exists between the "tpd" regarding the input terminal 1 and that regarding the input terminal 2. Consequently, the abnormal phenomenon inherent in the conventional circuit, i.e., the change of the state of the output terminal 3 from "H" to "L" and again to "H" is never produced when the input terminals 1 and 2 change from "L" to "H".

Moreover, the circuit of the present invention can be improved by about 20% in the average overall power consumption as compared to the conventional circuit.

Figure 4A:
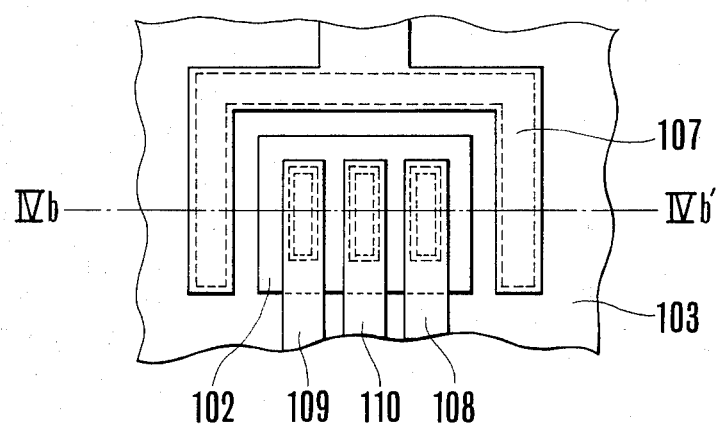
FIG. 4a is a plan view of PNP transistors (Q4, Q10) when the FIG. 3 circuit of this invention is embodied as an integrated circuit.
Figure 4B:
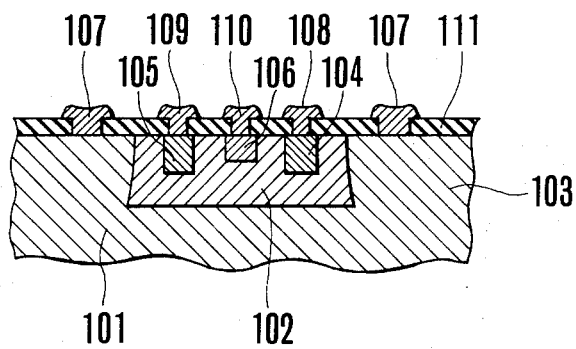

FIGS. 4a and 4b illustrate a plan view of the configuration of the PNP transistors Q4 and Q10 when the circuit of FIG. 3 is integrated and a sectional view taken along line 1Vb–1Vb′ in the plan view. FIGS. 4a and 4b illustrate a P-type semiconductor substrate 101, an N-type epitaxial layer 102, a P+-type insulation region 103, P-type regions 104 and 105, an N+-type region 106, aluminum electrodes or aluminum conductor layers 107 to 110, and an oxide film 111. Functionally, the P-type semiconductor substrate and N-type epitaxial layer 101 and 102 form a common collector for the PNP transistors Q4 and Q10, the P-type region 104 an emitter for the transistor Q4, and the P-type region 105 an emitter for the transistor Q10.

Although the embodiment of this invention has been described by way of the transistors whose base-collectors are clamped by the SBDs with the exception of the input PNP transistors Q1, Q4 and Q10 and the off-buffer transistor Q7, the present invention may obviously be applicable to a circuit which is formed of transistors with gold diffusion to eliminate the base-collector SBD clampings.

As described above, the present invention can provide the logic gate circuit which can reduce the delay time for signal transmission, the difference between the delay times regarding two input terminals, the overall power consumption and the number of circuit elements.

What is claimed is:

1. A NAND logic gate circuit comprising first and second terminals for connection to a power supply, a first transistor having a first main electrode coupled to said first terminal, a second main electrode coupled to said second terminal, and a control electrode for receiving a first input signal and generating a first output signal at said first main electrode, a second transistor having a first main electrode coupled to said first terminal, a second main electrode coupled to said second terminal, and a control electrode for receiving a second input signal and generating a second output signal at said first main electrode of said second transistor, an inverter transistor having a first main electrode, a second main electrode coupled to said second terminal, and a control electrode coupled to said first main electrode of said first transistor for receiving said first output signal, said inverter transistor providing a inverted first output signal at its first main electrode, logic gate means having an output terminal and receiving said second output signal and said first inverted output signal for generating a logical AND output signal on said output terminal; a third transistor having a first main electrode coupled to said first main electrode of said first transistor, a second main electrode coupled to said second terminal, and a control electrode responsive to said second input signal having a low value to change said first output signal to a low value independent of the value of said first input signal.

2. A NAND logic gate circuit according to claim 1 wherein said second input signal is applied to said control electrode of said third transistor.

3. In a NAND logic gate circuit comprising: an inverter circuit comprised of a first gate input circuit including a first PNP transistor having a base connected to a first input terminal; a collector connected to a ground terminal, and an emitter connected to a power supply terminal via a first resistor, and a first output circuit including a first NPN transistor having a base connected to an output of said first gate input circuit; an emitter connected to said ground terminal, and a collector connected to said power supply terminal via a second resistor and a NAND circuit comprised of a second gate input circuit including a second PNP transistor having a base connected to a second input terminal, a collector connected to said ground terminal, and an emitter connected to said power supply terminal via a third resistor, a second output circuit including a second NPN transistor having a base, a collector connected to an output terminal and an emitter connected to said ground terminal, a phase split stage circuit including a third NPN transistor having an emitter connected to said base of said second NPN transistor, a collector connected to said power supply terminal via a fourth resistor; and a base connected to an output of said second gate input circuit and to an output of said inverter circuit, and an off buffer circuit including at least a fourth NPN transistor having a base connected to the collector of said third NPN transistor, a collector connected to said power supply terminal via a fifth resistor, and an emitter connected to said output terminal, the improvement wherein a third PNP transistor having an emitter connected to said emitter of said first PNP transistor, a base connected to said second input terminal, and a collector connected to said ground terminal, and wherein said collector of said first NPN transistor is disconnected from said second resistor and said power supply terminal and is connected directly to the base of said third NPN transistor thereby decreasing the amount of electric current which flows out to said second input terminal from said inverter circuit when said first input terminal is in a high level and said second input terminal is in a low level.

4. A NAND logic gate circuit according to claim 3 wherein a PN junction diode is connected between the emitter of said first NPN transistor and said ground terminal.

5. A NAND logic gate circuit according to claim 3 which is integrated wherein said second PNP transistor and said third PNP transistor are formed within one and the same isolated region.

* * * * *

UNITED STATES PATENT AND TRADEMARK OFFICE
CERTIFICATE OF CORRECTION

PATENT NO. : 4,507,575
DATED : March 26, 1985
INVENTOR(S) : Susumu Mori, et al.

It is certified that error appears in the above-identified patent and that said Letters Patent is hereby corrected as shown below:

Column 3, line 33, delete "stage. In" and insert ---- stages, ----.

Column 3, line 34, delete "this arrangement".

Column 3, line 35, delete "stage," and insert ---- stage. In this arrangement ----.

Column 7, line 33, delete "01" and insert ---- Q1 ----.

Signed and Sealed this

Sixteenth Day of July 1985

[SEAL]

Attest:

DONALD J. QUIGG

Attesting Officer

Acting Commissioner of Patents and Trademarks